United States Patent [19]

Cline et al.

[11] 4,032,965

[45] June 28, 1977

[54] SEMICONDUCTOR VARISTOR EMBODYING A LAMELLAR STRUCTURE

[75] Inventors: Harvey E. Cline; Thomas R. Anthony, both of Schenectady, N.Y.

[73] Assignee: General Electric Company, Schenectady, N.Y.

[22] Filed: Apr. 19, 1976

[21] Appl. No.: 678,292

Related U.S. Application Data

[63] Continuation-in-part of Ser. No. 556,740, March 10, 1975, abandoned, which is a continuation of Ser. No. 411,016, Oct. 30, 1973, abandoned.

[52] U.S. Cl. .................................. 357/76; 357/60; 357/63; 357/88; 357/89; 357/90

[51] Int. Cl.$^2$ .................. H01L 23/32; H01L 29/04; H01L 29/167

[58] Field of Search .................. 357/60, 63, 76, 88, 357/89, 90

[56] References Cited

UNITED STATES PATENTS

| | | | |
|---|---|---|---|
| 2,813,048 | 11/1957 | Pfann | 357/60 |
| 3,514,715 | 5/1970 | Kosonocky | 357/76 |

*Primary Examiner*—Edward J. Wojciechowicz
*Attorney, Agent, or Firm*—Donald M. Winegar; Joseph T. Cohen; Jerome C. Squillaro

[57] ABSTRACT

A varistor has a lamellar structured body of semiconductor material. The lamellar structure is produced by migrating "wires" of a metal by a temperature gradient zone melting process through the solid material of the body to form a plurality of alternate regions of opposite type conductivity. A P-N junction is formed at the contiguous surfaces of the material of each pair of regions of opposite type conductivity. The material of the regions formed by the migrated wires is recrystallized semiconductor material of the body suitably doped with metal of the wire migrated therethrough to impart a predetermined type conductivity and a predetermined level of resistivity thereto.

20 Claims, 6 Drawing Figures

SEMICONDUCTOR VARISTOR EMBODYING A LAMELLAR STRUCTURE

CROSS REFERENCE TO RELATED PATENT APPLICATION

This application is a continuation-in-part of our copending application, Ser. No. 556,740, filed Mar. 10, 1975, now abandoned, which in turn was a continuation of our copending application, Ser. No. 411,016, filed Oct. 30, 1973, now abandoned, and assigned to the same assignee as the present invention.

BACKGROUND OF THE INVENTION

1. Field of the Invention

This invention relates to semiconductor varistors and a method of making the same.

2. Description of the Prior Art

Varistors are nonlinear resistive elements commonly used to protect electrical circuits or electrical apparatus from high voltage surges. In particular, it is often desirable to protect power lines from high voltage surges to protect the transformers, insulators and electrical equipment associated therewith. One type of prior art varistor embodies a polycrystalline material such, for example, as a zinc oxide-bismuth oxide combination. However, it has been discovered that materials such as this combination experience an increase in leakage current with the passage of time. One could use a plurality of several connected back-to-back Zener diodes but the economics of such a system is prohibited. Additionally, each electrical connection is a potential source of failure particularly if a sound electrical connection has not resulted from the joining operation.

An object of this invention is to provide a new and improved semiconductor varistor which overcomes the deficiencies of the prior art devices.

Another object of this invention is to provide a new and improved semiconductor varistor having a lamellar structure including spaced regions of recrystallized substrate material.

Another object of this invention is to provide a new and improved semiconductor varistor having a lamellar structure including spaced regions of recrystallized substrate material having a substantially uniform dopant impurity concentration through the regions.

Other objects of this invention will, in part, be obvious and will, in part, appear hereinafter.

BRIEF DESCRIPTION OF THE INVENTION

In accordance with the teachings of this invention there is provided a new and improved varistor comprising a body of semiconductor material having two major opposed surfaces which are, respectively, the top and bottom surfaces of the body. The material of the body has a predetermined level of resistivity, a predetermined first type conductivity, a preferred crystal structure and a vertical axis substantially perpendicular to the major opposed surfaces which is aligned substantially parallel with a first crystal axis of the semiconductor material of the body. At least one of the opposed major surfaces has a predetermined crystal planar orientation which is one selected from the group consisting of (100), (110) and (111).

A plurality of spaced planar regions are formed in the body. Each region consists of recrystallized semiconductor material of the body. The recrystallized material has a predetermined second and opposite type conductivity and a predetermined level of resistivity. Each spaced planar region is oriented so as to be aligned with a second preferred crystal axis of the semiconductor material of the body. Each of the spaced planar regions extends between, and terminates, in the opposed major surfaces of the body. Each planar region is oriented substantially perpendicular to the major surfaces and has a vertical axis aligned substantially parallel with the vertical axis of the body and the first preferred crystal axis of the material of the body.

The recrystallized material of each spaced planar region is formed in situ by the migration of a melt of metal-rich semiconductor material of the body through the material of the body by thermal gradient zone melting at a predetermined elevated temperature along a thermal gradient aligned substantially parallel with the first preferred crystal axis and the vertical axis of the body. The recrystallized material has a predetermined level of concentration of the metal of the melt therein as determined by the solid solubility limit of that metal in that semiconductor material at that predetermined elevated temperature of migration. The migrated metal includes at least one dopant impurity material to impart the predetermined type conductivity and predetermined level of resistivity to the recrystallized semiconductor material. The migrated metal is distributed substantially uniformly throughout the material of the planar region.

A P-N junction is formed by the abutting contiguous surfaces of the material of opposite type conductivity of each of the planar regions and that of the body. Each P-N junction is oriented substantially perpendicular to, and is exposed at, the major opposed surfaces of the body.

The spaced planar regions and the material of the body between each pair of planar regions define a lamellar structure of a plurality of integral diodes arranged in a series electrical circuit relationship. Electrical contact means are affixed to selected surface areas of the body to enable a predetermined number of the P-N junctions to be biased in series and thereby cause the integral diode structure as defined by the contact means to function as a varistor when electrical potential is applied thereto.

DESCRIPTION OF THE INVENTION

Figure 1:
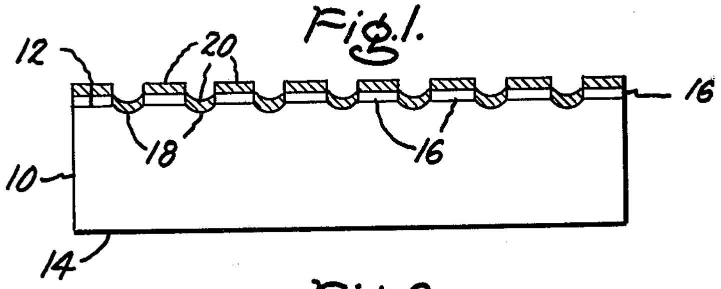
FIGS. 1, 2 and 3 are elevation views of a body of semiconductor material processed in accordance with the teachings of this invention.

With reference to FIG. 1, there is shown a body 10 of semiconductor material having a selected resistivity and a first type conductivity. The body 10 has opposed major surfaces 12 and 14 which are, respectively, the top and bottom surfaces thereof and a vertical axis which is aligned substantially parallel with a preferred crystal axis of the material of the body 10. The semiconductor material comprising the body 10 may be silicon, germanium, silicon carbide, gallium arsenide, a compound of a Group II element and a Group VI element and a compound of a Group III element and a Group V element.

At least one major surface has a preferred planar crystal orientation which is one selected from the group consisting of (100), (110) and (111).

The body 10 is mechanically polished, chemically etched to remove any damaged surfaces, rinsed in deionized water and dried in air. An acid resistant mask 16 is disposed on the surface 12 of the body 10. Preferably, the mask is of silicon oxide which is either thermally grown or vapor deposited on the surface 12 by any of the methods well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80° C. A suitable mask of spaced lines of a predetermined thickness and spaced a predetermined distance apart is disposed on the layer of photoresist and exposed to ultraviolet light. After exposure, the layer of photoresist is washed in xylene to open windows in the mask where the lines are desired so as to be able to selectively etch the silicon oxide layer 16 exposed in the windows.

Selective etching of the layer 16 of silicon oxide is accomplished with a buffered hydrofluoric acid solution ($NH_4F$—HF). The etching is continued until a second set of windows corresponding to the windows of the photoresist mask is opened inn the layer 16 of silicon oxide to expose selective portions of the surface 12 of the body 10 of silicon. The processed body 10 is rinsed in deionized water and dried. The remainder of the photoresist mask is removed by immersion in concentrated sulfuric acid at 180° C or immersion in a mixture of 1 part by volume hydrogen peroxide and 1 part by volume concentrated sulphuric acid.

Selective etching of the exposed surface of areas of the body 10 is accomplished with a mixed acid solution. The mixed acid solution is 10 parts by volume nitric acid, 70%, 4 parts by volume acetic acid, 100%, and 1 part by volume hydrofluoric acid, 48%. At a temperature of from 20° C to 30° C, the mixed acid solution selectively etches the silicon of the body 10 at a rate of approximately 5 microns per minute. A trough 18 is etched in the surface 12 of the body 10 beneath each window of the oxide layer 16. The selective etching is continued until the depth of the trough 18 is approximately equal to the width of the window in the silicon oxide layer 16. However, it has been discovered, that the trough 18 should not be greater than approximately 25 microns in depth because undercutting of the silicon oxide layer 16 will occur. Undercutting of the layer 16 of silicon oxide has a detrimental effect on the width of the device to be migrated through the body 10. Etching for approxmately 5 minutes at a temperature of 25° C will result in a trough 18 of from 25 to 30 microns in depth for a window width of from 10 to 500 microns. The etched body 10 is rinsed in distilled water and blown dry. Preferably, a gas such, for example, as freon, argon and the like, is suitable for drying the processed body 10.

The processed body 10 is disposed in a metal evaporation chamber. A metal layer 20 is deposited on the remaining portions of the layer 16 of silicon oxide and on the exposed silicon in the troughs 18. The metal in the troughs 18 are the metal "wires" to be migrated through the body 10. The metal of the layer 20 comprises a material, either substantially pure in itself or suitably doped by or more materials to impart a second and opposite type conductivity to the materials of the body 10 through which it migrates. The range of thickness of the layer 20 is preferably from 10 microns to about 25 microns and usually approximately equal to the depth of the trough 18. Therefore, if the trough 18 is 20 microns deep, the layer 20 is approximately 20 microns in thickness. A suitable material for the metal layer 20 is aluminum to obtain P-type regions in N-type silicon semiconductor material. Prior to migrating the metal wires in the troughs 18 through the body of silicon 10, the excess metal of the layer 20 is removed from the silicon oxide layer 16 by such suitable means as grinding away the excess metal with a 600 grit carbide paper.

It has been discovered that the vapor deposition of the layer 20 of aluminum metal should be performed at a pressure of approximately $1 \times 10^{-5}$ torr but not greater than $5 \times 10^{-5}$ torr. When the pressure is greater than $3 \times 10^{-5}$ torr, we have found that in the case of aluminum metal dispositied in the trough 18, the aluminum does not penetrate into the silicon and migrate through the body 10. It is believed that the layer of aluminum is saturated with oxygen and prevents good wetting of the contiguous surfaces of silicon. The initial melt of aluminum and silicon required for migration is not obtained because of the inability of aluminum atoms to diffuse into the silicon interface. In a like manner, aluminum deposited by sputtering is not desirable as the aluminum appears to be saturated with oxygen from the process. The preferred methods of depositing aluminum on the silicon body 10 are by the electron beam method and the like wherein little if any oxygen can be trapped in the aluminum.

The processed body 10 is placed in a migration apparatus, not shown, and the metal wires in the troughs 18 are migrated through the body 10 by a thermal gradient zone melting process. A thermal gradient of a range of approximately 50° C per centimeter to about 200° C per centimeter is established between the bottom surface 14, which is the hot face, and the surface 12, which is the cold face, has been discovered to be appropriate for use with apparatus operating at an elevated temperature range of from about 800° C to about 1400° C. The thermal gradient is aligned substantially parallel with the vertical axis of the body 10. The process is practiced for a sufficient length of time to migrate all the metal wires through the body 10. For example, for aluminum wires of 20 microns thickness, a thermal gradient of 50° C/cm at 1200° C aparatus temperature at a pressure of $1 \times 10^{-5}$ torr, a furnace time of less than 12 hours is required to migrate the wires through a silicon body 10 of one centimeter thickness.

The temperature gradient zone melting process and apparatus is not a part of this invention. For a more thorough understanding of the temperature gradient zone melting process and the apparatus employed for the process, one is directed to our following copending applications filed concurrently with this patent application and assigned to the same assignee of this invention: High Velocity Thermal Migration Method of Making Deep Diode Devices, U.S. Pat. No. 3,898,106; Deep Diode Device Having Dislocation-Free P-N Junctions and Method, U.S. Pat. No. 3,902,925; Deep Diode Devices and Method and Apparatus, Ser. No. 411,001, now abandoned in favor of Ser. No. 552,154; Deep Diode Array Produced by Thermomigration of Liquid Droplets, U.S. Pat. No. 3,901,736; Large Scale Thermomigration Process, Ser. No. 411,021; and The Stabilized Droplet Migration Method of Making Deep Diodes Having Uniform Electrical Properties, U.S. Pat. No. 3,899,361.

The migration of metal wires is preferably practiced in accordance with the planar orientations, migration directions, stable wire directions and stable wire sizes of the following Table:

Table

| Wafer Plane | Migration Direction | | Stable Wire Directions | Stable Wire Sizes |
|---|---|---|---|---|
| (100) | < 100 > | | < 011 >* | < 100 microns |
| | | | < 011 >* | < 100 microns |
| (110) | < 110 > | | < 110 >* | < 150 microns |
| (111) | < 111 > + | a) | < 011 > | |
| | | | < 101 > | < 500 microns |
| | | | < 110 > | |
| | | b) | < 112 >* | |
| | | | <211 >* | < 500 microns |
| | | | < 121 >* | |
| | | c) | Any other Direction in (111) plane* | < 500 microns |

*The stability of the migrating wire is sensitive to the alignment of the thermal gradient with the < 100 >, < 110 > and < 111 > axis, respectively.
+ Group a is more stable than group b which is more stable than group c.

Figure 2:
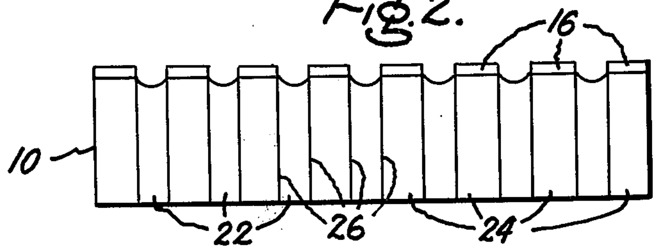

Upon completion of the temperature gradient zone melting process the resulting processed body 10 is as shown in FIG. 2. The thermal migration of the metal wires in the troughs 18 through the body 10 produces a body 10 having a lamellar structure of a plurality of first spaced regions 22 of a second and opposite type conductivity than the body 10. Each region 22 is recrystallized material of the body 10 suitably doped with a material comprising the metal wires and having an impurity concentration sufficient to obtain the desired conductivity. The metal retained in the recrystallized region is substantially the maximum allowed by the solid solubility limit of that metal migrated in that semiconductor material at that elevated temperature of migration. It is a semiconductor material with maximum solid solubility of the impurity material therein as determined by the termperature of migration. It is not semiconductor material which has liquid solubility of the material. Neither is it a semiconductor material which has eutectic material therein. The region 22 has a constant uniform level of impurity concentration throughout the entire planar region. The width of the region 22 is substantially constant for the entire region. The peripheral surface of each planar region 22 comprises in part the top surface 12, the bottom surface 14 and the peripheral side surface of the body 10.

Additionally, the body 10 is divided into a plurality of spaced regions 24 having the same, or first, type conductivity as the body 10. A P-N junction 26 is formed by the contiguous surfaces of each pair of mutually adjacent regions 22 and 24 of opposite type conductivity. The P-N junction 26, as formed, is very abrupt and distinct resulting in a step junction. The P-N junction 26 may be linearly graded by a post-thermomigration anneal if desired.

Figure 3:
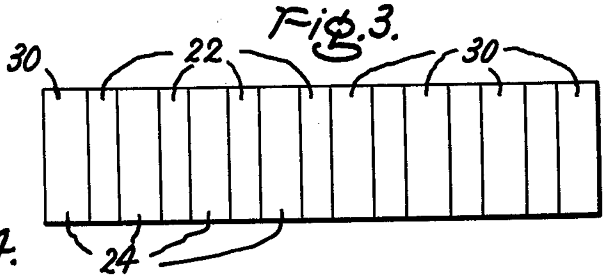

The resulting lamellar structure is a plurality of planar regions of alternate and opposite type conductivity as shown in FIG. 3. It is a plurality of integral diodes 30, each diode comprising two regions 22 and 24 of opposite type conductivity. The integral diodes 30 are arranged in a series electrical circuit. The structure may also be divided into a plurality of chips having a similar configuration.

Figure 4:
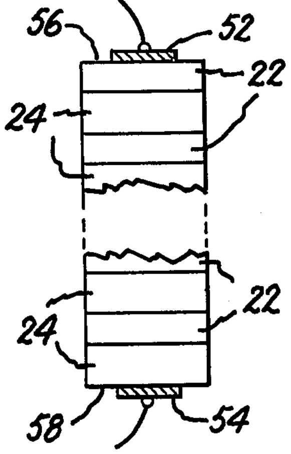
FIG. 4 is a semiconductor varistor made in accordance with the teachings of this invention.

Referring now to FIG. 4, there is shown a varistor 50 embodying the processed body 10 and its lamellar structure. Those items denoted by the same reference numbers are the same as, and function in the same manner as, the corresponding items of FIGS. 2 and 3. Electrical contacts 52 and 54 are affixed to respective opposed major surfaces 56 and 58 of the varistor 50.

The varistor 50 embodying the lamellar structure made by the temperature gradient zone melting process has many advantages over the prior art devices at moderate power levels of the order of 0.1 to 10 watts. Among these advantages are a rapid response to increasing, positive or negative, application of voltage, a stable operating behavior and a more precise control of voltage. In comparison to prior art device embodying series circuit connected diodes the varistor 50 proves to be less expensive. In addition, the separate physical electrical connection between each series connected diode, which is potential source of failure because of an open electrical joint and/or a high resistance joint occurring, is eliminated by the lamellar structure of the varistor 50 which is essence is a single packaged device. In comparison to prior art devices embodying polycrystalline material, the varistor 50 has a sharper break down. In addition, the varistor 50 has a long term inherent physical characteristic stability since the lamellar structure comprises a plurality of P-N junctions in a body of semiconductor material. In comparison to prior art devices embodying epitaxially grown material, the varistor of this invention has P-N junctions formed by the migration of suitable "wires" which produce substantially clean P-N junctions. High temperature processing is avoided and the lifetime of the substrate material is maintained.

To illustrate the excellent electrical characteristics of the varistor of this invention, a body of N-type silicon having 10 ohm-centimeter resistivity and a carrier concentration of $5 \times 10^{14}$ atoms per cubic centimeter was processed in accordance with the body 10 relative to FIGS. 1 through 3. The regions 22 were formed by the temperature gradient zone melting process of migrating aluminum "wires" through the silicon body. Each region 22 was P-type conductivity recrystallized semiconductor material of the body and had a carrier concentration of $2 \times 10^{19}$ atoms per cubic centimeter and a resistivity of $8 \times 10^{-3}$ ohm-centimeter. The resulting lamellar structure had regions 22 and 24 each 13 mils or 325 microns in width.

Figure 5:
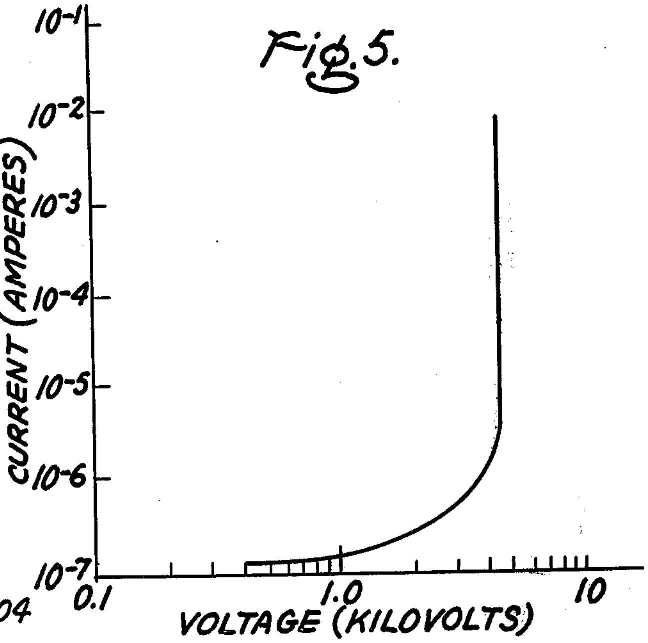
FIG. 5 is a graph of current versus voltage of the semiconductor varistor of FIG. 4.

A varistor measuring 0.6 centimeter in length, 1 centimeter in width and 0.2 centimeter in thickness was prepared from the above processed body. The varistor has 10 P-N junctions. The breakdown voltage of the varistor was 4,500 volts. A graph of the current in amperes versus the applied positive voltage in kiovolts is shown in FIG. 5.

The varistor showed excellent electrical characteristics for employment in electrical circuits to protect electrical equipment from over voltages. The resistivity throughout the N and P regions was substantially constant for the overall region. The processed body exhibited substantially theoretical physical values for the material utilized. The varistor was sectioned, mounted and examined. The P-N junctions were sharply defined and each one has a concentration profile about 0.3 micron in width. It is believed that the thermal gradient zone melting improves the P-N junction characteristics in that contaminants in the semiconductor materials of the body are gathered and removed from the body in much the same manner as in zone refining techniques. In prior art techniques embodying diffusion, alloying and epitaxial growth, the contaminants of the materials employed and/or produced thereby remain on the surface of the wafer being processed and/or become entrapped within the material thereby degrading its electrical characteristics.

Figure 6:
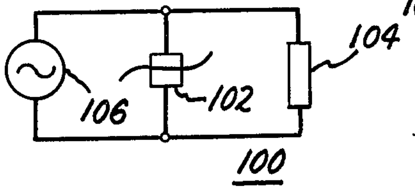
FIG. 6 is an electrical circuit embodying the semiconductor varistor of FIG. 4.

FIG. 6 illustrates a simple electrical circuit arrangement 100 embodying the varistor 102 of this invention. The varistor 102 is connected in a parallel circuit arrangement with electrical equipment 104 which is to be protected against over voltages. The varistor 102 is designed to conduct and short out the circuit to the equipment 104 when a specified voltage in the circuit occurs. The specified voltage is a selected increment beneath that which the equipment 104 can safely endure without failure. An electrical power source 106 supplies the power to the circuit 100 and impresses the voltage across the varistor 102 and electrical equipment 104.

The varistor of this invention is particularly useful in applications for automobiles and television receivers. In particular, the migration of an aluminum wire through N-type silicon having a resistivity of 0.01 ohm-centimeter produces a diode having a Zener break down of approximately 4 volts. A lamellar varistor incorporating regions formed by the migration of 10 aluminum wires by the thermal gradient zone melting process enables one to manufacture a voltage regulator of approximately 40 volts and still having Zener breakdown characteristics. Such a device made in accordance with the teachings of this invention has superior physical characteristics than prior art voltage regulators.

A low voltage automotive varistor is manufactured in accordance with the teachings of this invention by migrating six aluminum-rich liquid wires through $N^+$-type silicon having a resistivity of approximately 0.01 ohm-centimeter. The resulting varistor has a lamellar structure of twelve alternate $P^+$ and $N^+$ regions. Each pair of $P^+$ and $N^+$ regions encompasses a P-N junction having Zener characteristics. The Zener junction has a break over voltage of approximately 4 bolts. The varistor, as made, has a capability of clamping at approximately 24 volts. This varistor of this invention is capable of operating in temperatures up to approximately 250° C and is greatly superior to prior art devices.

A high voltage clamp is possible embodying the lamellar structured varistor of this invention. Sixty aluminum wires are migrated by the temperature gradient zone melting process through a body of N-type silicon having a resistivity of 10 ohm-centimeter. Each P-N junction in the lamellar varistor break down at approximately 400 volts. The overall break down voltage for the device is in excess of 2400 volts and is suitable for use as a high voltage clamp in television receivers to prevent voltage spikes within the receivers from generating X-rays.

We claim as our invention:

1. A varistor comprising a body of semiconductor material having two opposed major surfaces forming respectively the top and bottom surfaces of the body, a predetermined level of resistivity, a predetermined first type conductivity, a preferred crystal structure and a vertical axis substantially perpendicular to the major opposed surfaces aligned substantially parallel with a first crystal axis of the semiconductor material of the body;

at least one of the opposed major surfaces having a predetermined crystal planar orientation which is one selected from the group consisting of (100), (110), and (111);

a plurality of spaced planar regions formed in the body, each region consisting of recrystallized semiconductor material of the body having a second and opposite type conductivity and a predetermined level of resistivity and so oriented as to be aligned with a second preferred crystal axis of the material of the body;

each of the spaced planar regions extending between, and terminating in, the opposed major surfaces of the body and oriented substantially perpendicular thereto and having a vertical axis aligned substantially parallel with the vertical axis of the body and the first preferred crystal axis of the material of the body;

the recrystallized material of each spaced planar region is formed in situ by the migration of a melt of metal-rich semiconductor material of the body through the material of the body by thermal gradient zone melting at a predetermined elevated temperature along a thermal gradient aligned substantially parallel with the first preferred crystal axis, and the vertical axis of the body and has a pedetermined level of concentration of the metal of the melt therein as determined by the solid solubility limit of that metal in that semiconductor material at that predetermined elevated temperature of migration;

the metal includes at least one dopant impurity material to impart the predetermined type conductivity and predetermined level of resistivity to the recrystallized semiconductor material and the metal is distributed substantially uniformly throughout the material of the region;

a P-N junction formed by the abutting, contiguous surfaces of the material of opposite type conductivity of each of the planar regions and that of the body;

each P-N junction being substantially perpendicular to, and exposed at, the major opposed surfaces of the body;

the spaced planar regions and the material of the body between each pair of planar regions defining a lamellar structure of a plurality of integral diodes arranged in a series electrical circuit relationship, and electrical contact means affixed to selected surface areas of the body to enable a predetermined number of P-N junctions to be biased and cause the integral diode structure defined by the contact means to function as a varistor when electrical potential is applied thereto.

2. The varistor of claim 1 wherein the semiconductor material is one selected from the group consisting of silicon, silicon carbide, gallium arsenide and germanium.

3. The varistor of claim 2 wherein the semiconductor material is silicon, the first type conductivity is N-type, and the dopant impurity material in the recrystallized material of the spaced planar regions is aluminum.

4. The varistor of claim 3 wherein the predetermined resistivity of the silicon semiconductor material is 10 ohm-centimeter, and the predetermined level of concentration of the aluminum is $2 \times 10^{19}$ atoms per cubic centimeter in the recrystallized material.

5. The varistor of claim 3 wherein the predetermined resistivity of the silicon semiconductor material is 0.01 ohm-centimeter and the predetermined level of concentration of the aluminum in the recrystallized material is $2 \times 10^{19}$ atoms per cubic centimeter.

6. The varistor of claim 1 wherein the one of two opposed major surfaces of the body has a preferred planar crystal orientation of (100);

the first preferred crystal axis is $< 100 >$, and the second preferred crystal axis is one selected from the group consisting of $< 011 >$ and $< 0\bar{1}1 >$.

7. The varistor of claim 6 wherein the semiconductor material of the body is one selected from the group consisting of silicon, germanium, silicon carbide and gallium arsenide.

8. The varistor of claim 7 wherein the semiconductor material is silicon, the first type conductivity is N-type, and the dopant impurity material in the recrystallized material of the spaced planar regions is aluminum.

9. The varistor of claim 8 wherein the predetermined resistivity of the silicon semiconductor material of the body 10 ohm-centimeter, and the predetermined level of concentration of the aluminum in the recrystallized material is $2 \times 10^{19}$ atoms per cubic centimeter.

10. The varistor of claim 9 wherein the resistivity of the silicon is 0.01 ohm-centimeter and the dopant impurity metal concentration of the aluminum is $2 \times 10^{19}$ ohm atoms per cubic centimeter.

11. The varistor of claim 1 wherein the preferred planar crystal orientation is (110);

the first preferred crystal axis is $> 110 >$, and the second preferred crystal axis is $< 1\bar{1}0 >$.

12. The varistor of claim 11 wherein the semiconductor material of the body is one selected from the group consisting of carbide, germanium and gallium arsenide.

13. The varistor of claim 12 wherein the semiconductor material is silicon, the first type conductivity is N-type, and the dopant impurity material in the recrystallized semiconductor material of the spaced planar regions is aluminum.

14. The varistor of claim 13 wherein the predetermined resistivity of the silicon semiconductor material of the body is 10 ohm-centimeter, and the predetermined level of concentration of the aluminum in the recrystallized semiconductor material is $2 \times 10^{19}$ atoms per cubic centimeter.

15. The varistor of claim 14 wherein the predetermined resistivity of the silicon semiconductor material of the body is 0.01 ohm-centimeter, and the predetermined level of concentration of the aluminum in the recrystallized semiconductor material is $2 \times 10^{19}$ ohm atoms per centimeter.

16. The varistor of claim 1 wherein the preferred planar crystal orientation is (111);

the first preferred crystal axis is $< 111 >$, and the second preferred crystal axis is one selected from the group consisting of $< 01\bar{1} >$, $< 10\bar{1} >$, $< 1\bar{1}0 >$, $< 11\bar{2} >$, $< \bar{2}11 >$ and $< 1\bar{2}1 >$.

17. The varistor of claim 16 wherein the semiconductor material of the body is one selected from the group consisting of silicon, silicon carbide, germanium and gallium arsenide.

18. The varistor of claim 17 wherein the semiconductor material of the body is silicon, the first type conductivity if N-type, and the dopant impurity material in the recrystallized semiconductor material is aluminum.

19. The varistor of claim 18 wherein the predetermined resistivity of the silicon semiconductor material of the body is 10 ohm-centimeter, and the predetermined level of concentration of the aluminum in the recrystallized semiconductor material is $2 \times 10^{19}$ atoms per cubic centimeter.

20. The varistor of claim 19 wherein the predetermined resistivity of the silicon semiconductor material of the body is 0.01 ohm-centimeter, and the predetermined level of concentration of the aluminum is $2 \times 10^{19}$ atoms per cubic centimeter.

* * * * *